United States Patent
Weng et al.

(10) Patent No.: US 10,462,274 B2
(45) Date of Patent: Oct. 29, 2019

(54) ADJUSTABLE AIR GAP FOR MOBILE DEVICES

(71) Applicant: INTEL CORPORATION, Santa Clara, CA (US)

(72) Inventors: Moss Weng, Taipei (TW); Alesi Hung, Xinbei (TW); Chang-Wu Yen, Taipei (TW); Ching-Shan Cheng, Taipei (TW)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/777,137

(22) PCT Filed: Dec. 26, 2015

(86) PCT No.: PCT/US2015/000400
§ 371 (c)(1),
(2) Date: May 17, 2018

(87) PCT Pub. No.: WO2017/111842
PCT Pub. Date: Jun. 29, 2017

(65) Prior Publication Data
US 2018/0359345 A1    Dec. 13, 2018

(51) Int. Cl.
*H04M 1/02* (2006.01)
*H05K 7/14* (2006.01)
(Continued)

(52) U.S. Cl.
CPC .......... *H04M 1/0277* (2013.01); *G06F 1/203* (2013.01); *H05K 7/142* (2013.01); *H05K 7/20436* (2013.01); *H05K 7/20336* (2013.01)

(58) Field of Classification Search
CPC . G06F 1/20; G06F 1/203; G06F 1/206; G06F 1/1613; G06F 2200/201;
(Continued)

(56) References Cited

U.S. PATENT DOCUMENTS 6,657,811 B1 * 12/2003 Codilian .............. G11B 5/5526
360/69
9,066,210 B2 * 6/2015 Kalita ..................... H04W 4/04
(Continued)

FOREIGN PATENT DOCUMENTS

JP    H 07-050373 A    2/1995

OTHER PUBLICATIONS

Korean IP Office—International Search Report of the International Searching Authority dated Sep. 23, 2016 for International Application No. PCT/US2015/000400 (5 pgs).
(Continued)

*Primary Examiner* — Meless N Zewdu
(74) *Attorney, Agent, or Firm* — Womble Bond Dickinson (US) LLP (57) ABSTRACT

Embodiments are generally directed to an adjustable gap structure for mobile devices. An embodiment of a mobile device includes a cover; a printed circuit board including a processing component and thermal solution, the printed circuit board being movable along a first axis towards or away from the cover to provide an adjustable air gap; one or more ferromagnetic elements coupled with the printed circuit board; and one or more magnets, wherein, in first mode, the one or more magnets are to attract the one or more ferromagnetic elements and maintain an air gap of a first distance between the thermal solution and the cover, and wherein, in a second mode, an external magnetic force is to pull the ferromagnetic elements away from the one or more magnets and reduce the air gap between the thermal solution and the cover.

21 Claims, 8 Drawing Sheets

(51) Int. Cl.
*H05K 7/20* (2006.01)
*G06F 1/20* (2006.01)

(58) Field of Classification Search
CPC ... H04W 52/288; H04W 88/02; H04W 92/08; H04M 1/02; H04M 1/0277; H04M 1/06; H04M 1/10; H04M 1/6033; H04M 1/605; H04M 1/62; H04M 1/6041; H04M 1/0202; H04M 1/0206; H04L 23/00; H04L 23/34; H04K 5/00; H04K 5/02; H04K 7/20; H04K 7/2039; H04K 1/00; H04B 1/40; H04B 1/401; H04B 1/3877; H05K 7/20; H05K 1/00; H05K 1/02; H05K 1/0201; H05K 1/0203; H05K 1/0236; H05K 7/142; H05K 7/1427; H05K 7/20436; H05K 7/20336

See application file for complete search history.

(56) References Cited

U.S. PATENT DOCUMENTS

| | | | | |
|---|---|---|---|---|
| 9,479,038 | B2* | 10/2016 | Smith | H02K 7/09 |
| 2002/0075648 | A1* | 6/2002 | Nakagawa | G06F 1/1601 |
| | | | | 361/690 |
| 2004/0090745 | A1 | 5/2004 | Mueller et al. | |
| 2006/0229502 | A1 | 10/2006 | Pollock et al. | |
| 2007/0081027 | A1* | 4/2007 | Beltran | B41J 2/14 |
| | | | | 347/46 |
| 2009/0113228 | A1 | 4/2009 | Mok et al. | |
| 2009/0266516 | A1* | 10/2009 | Jewell-Larsen | B05B 5/0255 |
| | | | | 165/84 |
| 2010/0079940 | A1 | 4/2010 | Mongia et al. | |
| 2011/0103011 | A1* | 5/2011 | Koplow | F04D 25/0606 |
| | | | | 361/679.54 |
| 2012/0326819 | A1* | 12/2012 | Malanczyj | H01F 7/04 |
| | | | | 335/295 |
| 2013/0225233 | A1* | 8/2013 | Elter | H04M 1/2535 |
| | | | | 455/552.1 |
| 2016/0239056 | A1* | 8/2016 | Saroor | G06F 1/1632 |

OTHER PUBLICATIONS

Korean IP Office—Written Opinion of the International Searching Authority dated Sep. 23, 2016 for International Application No. PCT/US2015/000400 (8 pgs).

PCT/US2015/000400, International Preliminary Report and Written Opinion, dated Jul. 5, 2018, (10 pages).

* cited by examiner

ADJUSTABLE AIR GAP FOR MOBILE DEVICES

CROSS-REFERENCE TO RELATED APPLICATION

This patent application is a U.S. National Phase application under 35 U.S.C. § 371 of International Application No. PCT/US2015/000400, filed on 26 Dec. 2015, entitled ADJUSTABLE GAP STRUCTURE FOR MOBILE DEVICES, the content of which is incorporated by reference in its entirety.

TECHNICAL FIELD

Embodiments described herein generally relate to the field of electronic devices and, more particularly, to an adjustable gap structure for mobile devices.

BACKGROUND

The processing ability of mobile devices, such as telephones and tablet computers, has greatly increased, while the form factor of such devices has generally been reduced in size. As a result, there can be a significant amount of heat generated by the processing elements (such as a processor or system on chip (SoC)) of such devices. Because such devices commonly come in contact the skin of a user, the generation of excess heat can be a significant factor in user comfort. As a result, the power consumed by such devices may need to be limited when used in handheld operation, thus also limiting the performance of mobile devices.

Mobile device users can potentially receive some improvement in user experience and performance when operating a mobile device in a docking mode, in which the mobile device is generally not in contact with the user, without needing to modify the form factor of the device. However, while it is possible to adjust the performance and heat generation of a mobile device depending on the usage of the device, the amount of performance gain is limited, and the adaptive performance does not address the core problem of excessive heat generation from the processing elements.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to adjustable gap structure for mobile devices.

For the purposes of this description:

"Mobile electronic device" or "mobile device" refers to a smartphone, smartwatch, tablet computer, notebook or laptop computer, handheld computer, mobile Internet device, wearable technology, or other mobile electronic device that includes processing capability.

In some embodiments, an apparatus, system, or process provides for an adjustable gap structure for mobile devices. In some embodiments, the adjustable gap structure adjusts a size of an air gap depending on the current mode or state of operation.

As mobile devices may operate in, for example, a handheld mode (a first mode) or a docking mode (a second mode when the device in a docking mechanism), the operation of a mobile device may be modified in the docking mode to provide additional performance. However, in order to provide a significant performance improvement in a mobile device while in a docking mode, an additional physical thermal solution in docking mode is required (a thermal solution being any element to conduct heat away from a component).

In handheld operation, it is extremely important to preserve a sufficient air gap between the processing element and the back cover to avoid heat directly transferring to the back cover, which may be in contact with the skin of the user. However, in a docking operation in which an additional thermal solution removes heat from the phone or tablet back cover, the reserved air gap in the mobile device becomes a critical resistance in a heat path from a processing element (such as an SoC) to the additional external thermal solution. In this situation, if performance is increased for docking, with the resulting increase in heat produced by the SoC, the SoC may reach a maximum junction temperature (a highest operating temperature for semiconductor within a device) before the mobile device is able to achieve a significant performance gain.

In some embodiments, a mobile device includes an adjustable gap structure to both provide a sufficient air gap for user comfort of operation in a handheld mode or state, while also reducing (or eliminating) the air gap in a docking mode to allow for increased heat transfer to an external thermal solution (such as a thermal solution of a device docking mechanism) and, as a result, providing improved performance in the docking mode.

In some embodiments, a mobile device include includes a force element or means to provide a force to provide an adjustable air gap for a processing element. In some embodiments, the force element or means includes one or more magnets to provide an adjustable air gap for the processing element, wherein the magnets operate to maintain a first air gap distance in a first state or mode (a handheld mode) and to allow reduction to a second air gap distance in a second state or mode (a docking mode).

In some embodiments, external magnetism, such as a magnetism within (using a permanent magnet) or generated by (using an electromagnet) a docking mechanism, is operable to overcome the magnetic force of the one or more magnets of the mobile device and thereby to reduce or eliminate the air gap in a docking mode. Stated in another way, when a mobile device is separated from a docking mechanism containing an external magnetic source, the mobile device is in a first state or mode, and when the mobile device is placed in contact with the docking mechanism, the mobile device transitions to the second state or mode. In some embodiments, the magnets of a mobile device are smaller or less powerful than a magnet or magnets of a docking mechanism.

In an alternative embodiment, a mobile device may include a different or additional element or means to provide a force to maintain an air gap in the mobile device. In some embodiments, the mobile device may include a spring or elastic mechanism in addition to or an alternative to the one or more magnets. In some embodiments, the spring or elastic mechanism is to provide or assist to provide the adjustable air gap for a processing element.

In some embodiments, a docking mechanism further includes a thermal solution (referred to herein as an external thermal solution for the mobile device) to draw heat away from the processing element of the mobile device through a cover or side of the mobile device.

In some embodiments, a docking mode further includes an increase in performance by a mobile device. In some embodiments, a mobile device may sense the connection of the mobile device to a docking mechanism, wherein the mobile device may allow the increase in performance upon sensing such connection. In an alternative embodiment a mobile device may includes one or more sensors to sense whether the processing element has been moved to reduce the air gap, where the mobile device may enable the increase in performance upon the one or more sensors indicating a successful reduction in the air gap. In some embodiments, a mobile device is to operate at a first performance level in a first mode and operate at a second performance level in a second mode, the second performance level being higher than the first performance level.

In some embodiments, a mobile device includes one or more metal brackets or other ferromagnetic elements that are attracted by the one or more magnets of the mobile device. In some embodiments, the attraction between the one or more magnets and the one or more ferromagnetic elements serves to maintain the air gap in a first mode (a handheld mode). In a particular embodiment, the one or more magnets re in contact with the one or more ferromagnetic elements when the mobile device is in the first state or mode, and the one or more magnets are separated from the one or more ferromagnetic elements when the mobile device is in the second state or mode, the external magnetic force to operate to pull the one or more ferromagnetic elements away from the one or more magnets of the mobile device. However, embodiments are not limited to this particular physical implementation.

In some embodiments, a processing element (which may in certain implementations include an attached thermal solution) is installed on a mother board or other printed circuit board (PCB), where the application of external magnetism is operable to pull brackets of the mother board or other PCB towards an external cover or plate of the mobile device, and thus reduce the air gap and improve heat conduction away from the processing component. In some embodiments, the processing component is nearer to, for example, an LCD touch screen when in the handheld mode, and is nearer to a back cover of the mobile device when in the docking mode.

In some embodiments, a mobile device includes a guide pin or similar element to constrain movement of a mother board or other printed circuit board to ensure that the mother board or other PCB moves only along a z-axis (perpendicular to a surface of the mother board or other structure).

In some embodiments, mobile device includes a simple and cost effective structure that can maintain an essential air gap in a handheld mode and reduce or eliminate the air gap in docking mode to increase the thermal conduction and allow improved performance.

In some embodiments, adjustable gap elements may further be implemented in different embodiment, such as in a snap-on phone or tablet case containing one or more magnets and an external thermal solution. With, for example, an embedded heat pipe and heat spreader in a case, the user can enjoy a higher performance and experience in a certain mode in which the mobile device is used within the case. In some embodiments, the cover or case may further provide insulation between the cover of the device and the skin of a user.

Figure 1:
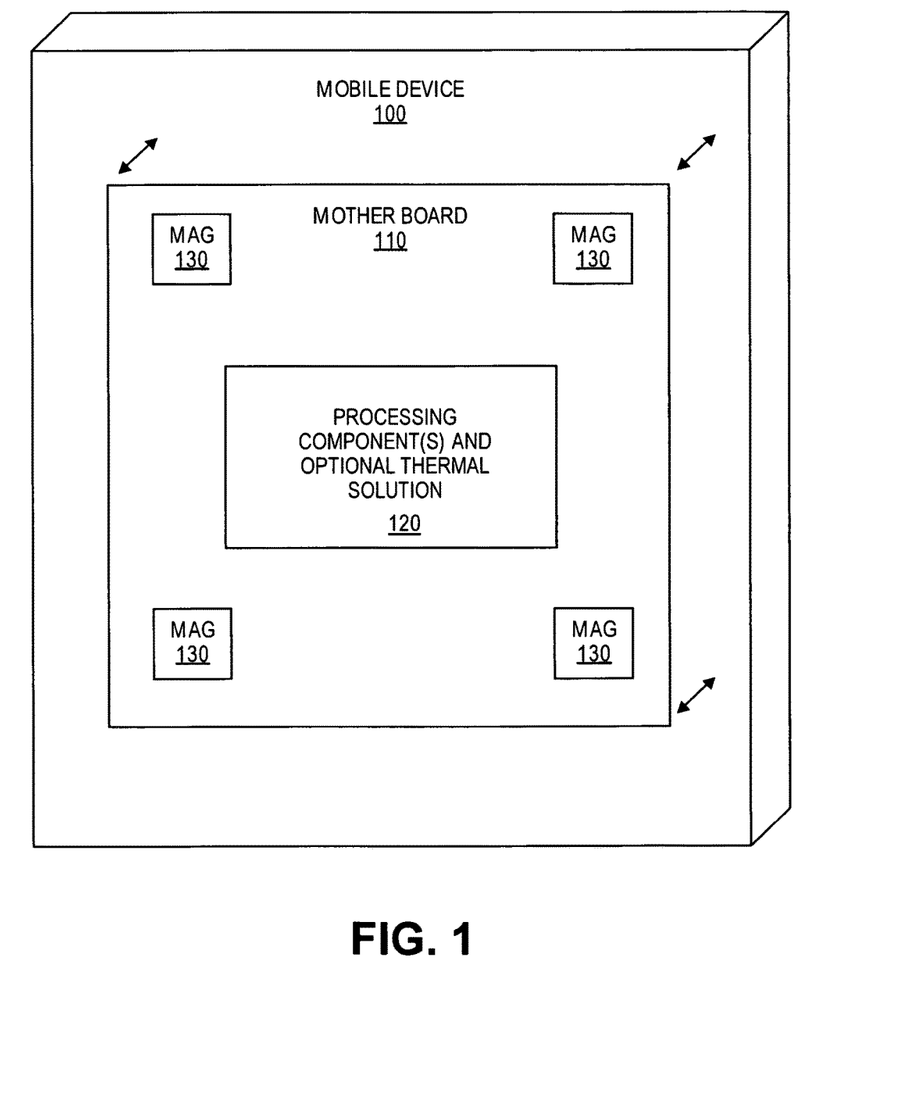
FIG. 1 is an illustration of a mobile device with an adaptable gap structure according to an embodiment.

FIG. 1 is an illustration of a mobile device with an adaptable gap structure according to an embodiment. In some embodiments, a mobile device 100 includes a mother board or other structure 110 containing one or more processing components (such as an SoC). In some embodiments, the mobile device further includes one or more magnets 130 (wherein the connection of the magnets is not shown in FIG. 1). In some embodiments, the mother board to include one or more brackets or other ferromagnetic elements, the magnets to maintain the air gap by the attraction of the ferromagnetic elements of the motherboard to the one or more magnets 130.

In some embodiments, the mother board is provide one degree of freedom in the mobile device 100, the magnets 130 to constrain and control the motherboard position. In some embodiments, in the structure of a mobile device, one or more screws are replaced by one or more guiding pins, together with pairs of metal brackets and magnets to constrain the mother board within the mobile device 100.

In some embodiments, the mobile device 100 may include a different or additional element or means to provide a force to maintain an air gap in the mobile device 100. In some embodiments, the mobile device 100 may include a spring or elastic mechanism in addition to or an alternative to the one or more magnets 130.

Figure 2:
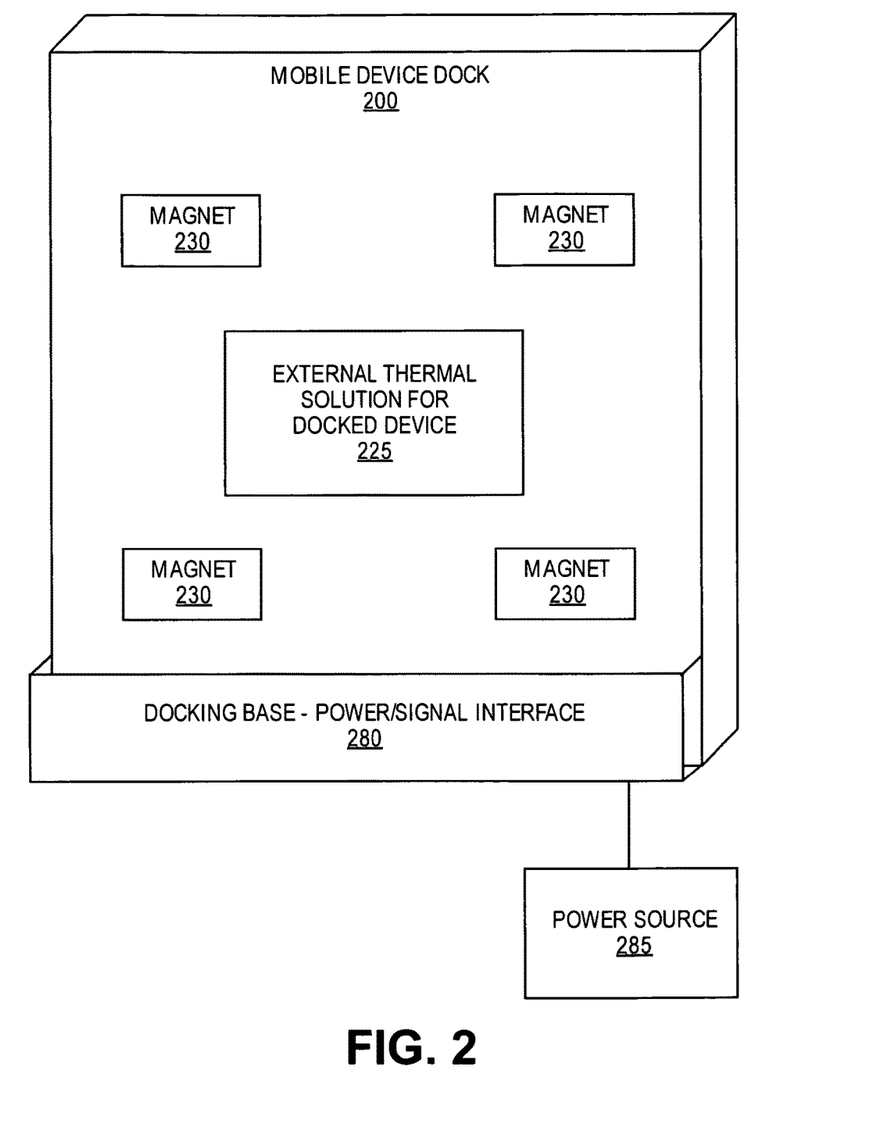
FIG. 2 illustrates a docking mechanism with external thermal solution for a docked device according to an embodiment.

FIG. 2 illustrates a docking mechanism with external thermal solution for a docked device according to an embodiment. In some embodiments, a mobile device dock 200 includes one or more magnets 230, the magnets providing a stronger magnetic force than the magnets within a mobile device. In some embodiments, the mobile device dock further includes an external thermal solution 225 for a docked mobile device. In some embodiments, the external thermal solution 225 may further include a fan to direct cooling air onto the mobile device. The dock 200 may further include a docking base 280 or similar element to hold a mobile device, together with providing a power and signal interface, including connection to a power source 285. However, embodiments are not limited to this structure and may include docking mechanism with, for example, an inductive charging station, wherein the mobile device may be charged when placed on top of a charging base.

Figure 3:
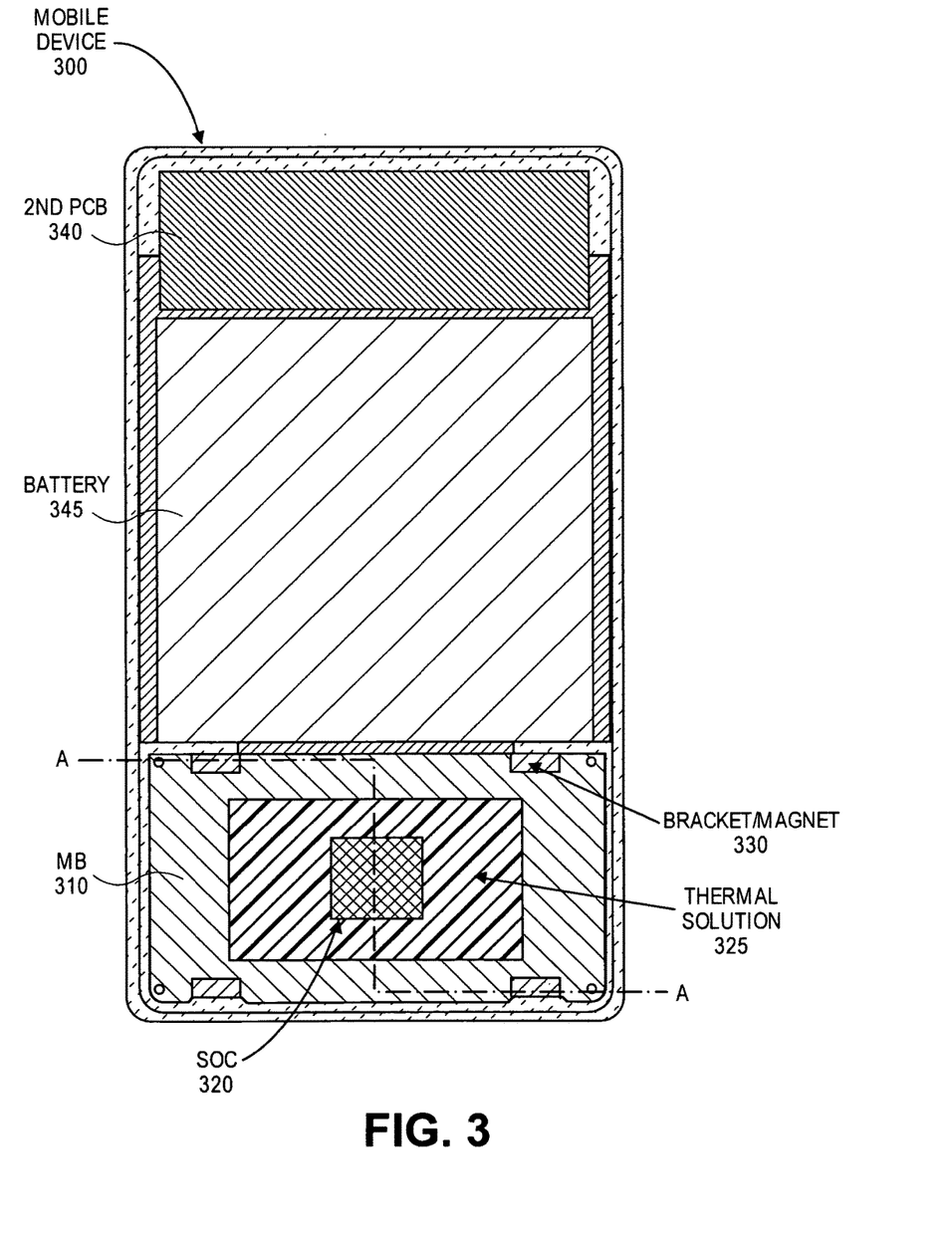
FIG. 3 illustrates a mobile device with adjustable air gap mechanism according to an embodiment.

FIG. 3 illustrates a mobile device with adjustable air gap mechanism according to an embodiment. As illustrated, a mobile device 300 may include a mother board 310 with system on chip 320. In some embodiments, the system on chip optionally includes a thermal solution 325. An air gap for the mother board 310 is maintained by one or more pairs of brackets and magnets 330. The mobile device 300 further includes, for example, a second printed circuit board 340 and battery 345. FIG. 3 illustrated a sectioning of the mobile device (A) that is illustrated in FIGS. 4 and 5.

Figure 4:
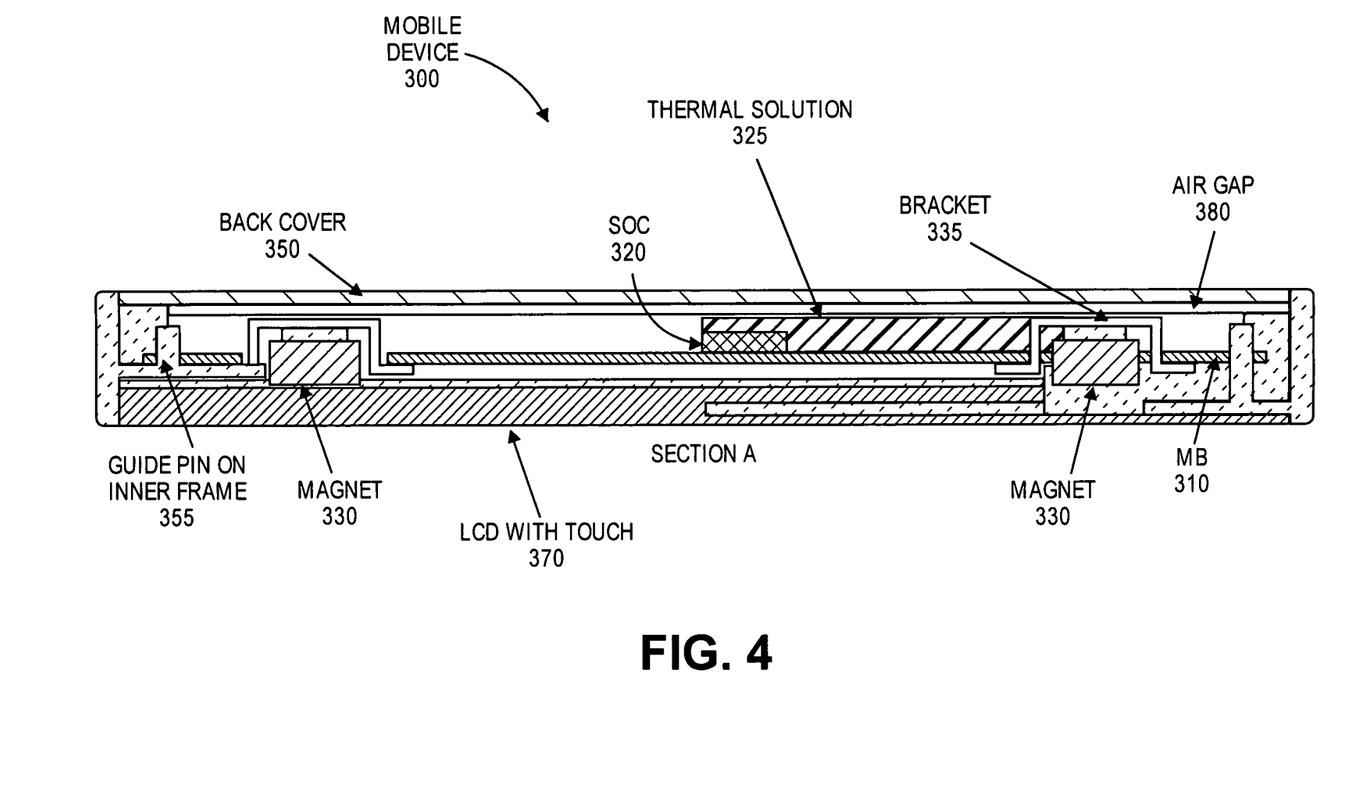
FIG. 4 illustrates a cross-section view of a mobile device according to an embodiment.

FIG. 4 illustrates a cross-section view of a mobile device according to an embodiment. In some embodiments, a mobile device 300 includes a mother board 310 including multiple ferromagnetic brackets 335, the brackets being constrained by magnets 330 to maintain an air gap between an optional thermal solution 325 of a system on chip 320 and a back cover 350 of the mobile device 300. (Illustration of a mobile device without inclusion of the thermal solution is provided in FIG. 7). In some embodiments, the mobile device 300 further includes one or more guide pins 355 to control a motion of the mother board 310 to a single degree of freedom along a z-axis. Also illustrated is an LCD touch screen 370, wherein the mother board 310 is maintained near to the touch screen 370 in the handheld mode. In certain embodiments, the back cover 350 may include a porous cover to allow for cooling by air flow.

Figure 5:
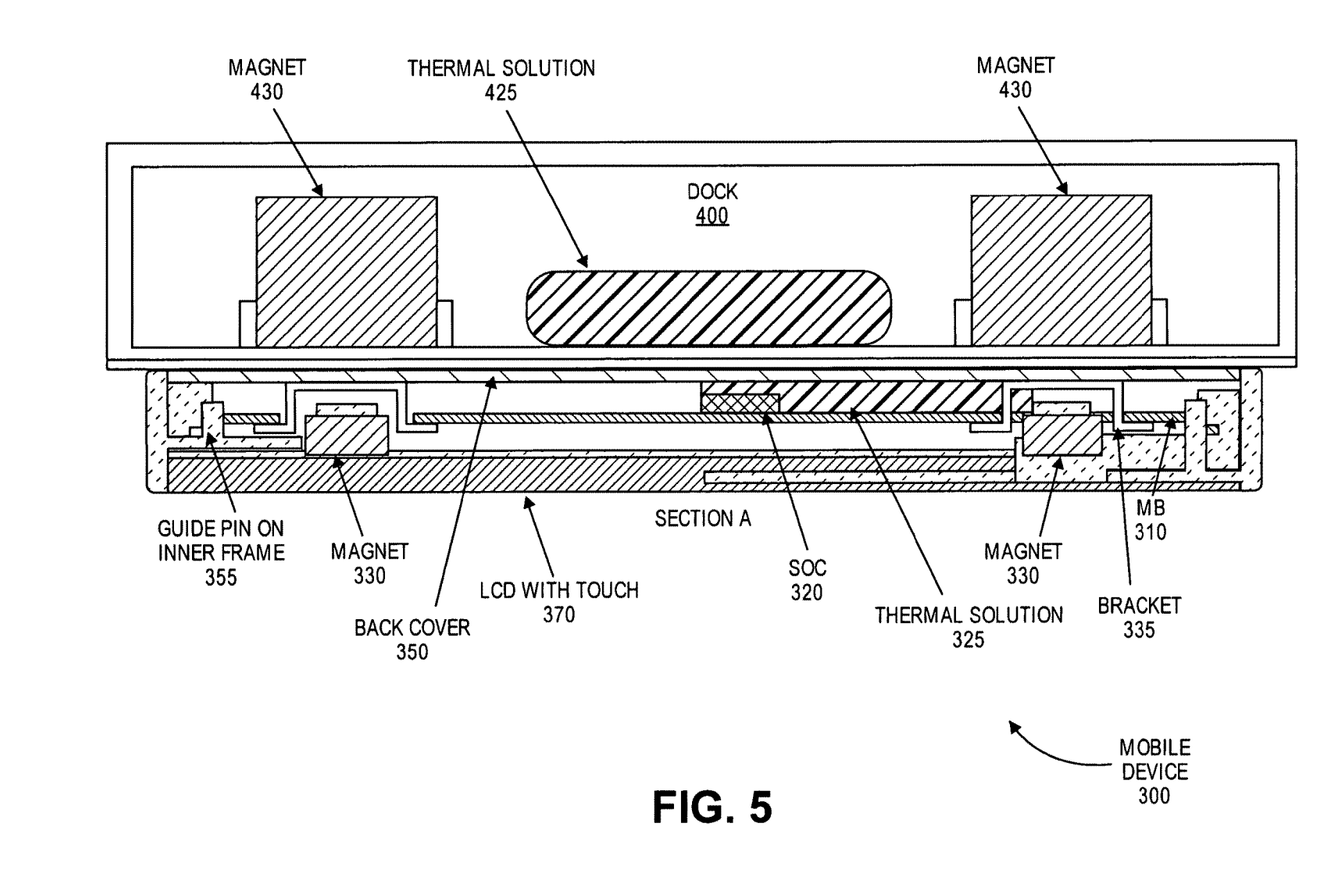
FIG. 5 illustrates a cross-section view of a mobile device and a mobile device dock according to an embodiment.

Table 1 illustrates example values for the illustration provided in FIG. 5:

TABLE 1

Handheld Mode

| SoC | | Magnet | |
|---|---|---|---|
| Back Cover | 0.8 | Back Cover | 0.8 |
| Gap | 0.8 | Gap | 0 |
| | | Bracket | 0.5 |
| Thermal Sol | 0.3 | Gap | 0.8 |
| Gap | 0.5 | Inner Frame | 0.9 |
| SoC | 1.4 | Magnet | 2.5 |
| PCB | 0.6 | Gap | 1.1 |
| Gap | 1.4 | Inner Frame | 0.8 |
| LCD with Touch | 2.2 | Front Lens | 0.6 |
| TOTAL | 8 | TOTAL | |

FIG. 5 illustrates a cross-section view of a mobile device and a mobile device dock according to an embodiment. As illustrated, the mobile device 300 includes a mother board 310 including the multiple ferromagnetic brackets 335. In this illustration, the brackets are no longer constrained by magnets 330, the air gap between the thermal solution 325 of the system on chip 320 and the back cover 350 of the mobile device 300 is now reduced or eliminated, the mother board moving away from LCD touch screen 370 and towards the back cover 350, following the path enabled by the one or more guide pins 355.

In some embodiments, a dock 400 includes a thermal solution 425 to allow additional cooling of the SoC 320 of the mobile device 300. In some embodiments, the dock further includes one or more magnets (permanent or electromagnets) 430, the magnets serving to overcome the magnetic attraction of magnets 330 and pull the brackets 335 and mother board toward the back cover 350 of the mobile device. In some embodiments, the thermal solution 425 may further include a fan to direct cooling air onto the mobile device.

Table 2 illustrates example values for the illustration provided in FIG. 5:

TABLE 2

Dock Mode

| SoC | | Magnet | |
|---|---|---|---|
| Back Cover | 0.8 | Back Cover | 0.8 |
| Gap | 0 | Gap | 0.8 |
| | | Bracket | 0.5 |
| Thermal Sol | 0.3 | Gap | 0 |
| Gap | 0.5 | Inner Frame | 0.9 |
| SoC | 1.4 | Magnet | 2.5 |

TABLE 2-continued

Dock Mode

| SoC | | Magnet | |
|---|---|---|---|
| PCB | 0.6 | Gap | 1.1 |
| Gap | 2.2 | Inner Frame | 0.8 |
| LCD with Touch | 2.2 | Front Lens | 0.6 |
| TOTAL | 8 | TOTAL | |

In comparing the phone mode and dock mode stacking, the gap between back cover and thermal solution is reduced from 0.8 mm to 0 mm, and the gap between the LCD touch screen and the PCB (mother board) increases from 1.4 mm to 2.2 mm. The change in gap distances from the phone mode and dock mode may provide at least two benefits:

(1) The eliminated gap between back cover and the thermal solution can significantly reduce the thermal resistance between SoC to back cover and to the thermal solution in dock to remove extra heat from SoC in high performance.

(2) The increased gap between the LCD touch screen and PCB can increase the thermal resistance between these elements, and reduce the impact to LCD screen temperature while the SoC runs in a high performance state.

Figure 6:
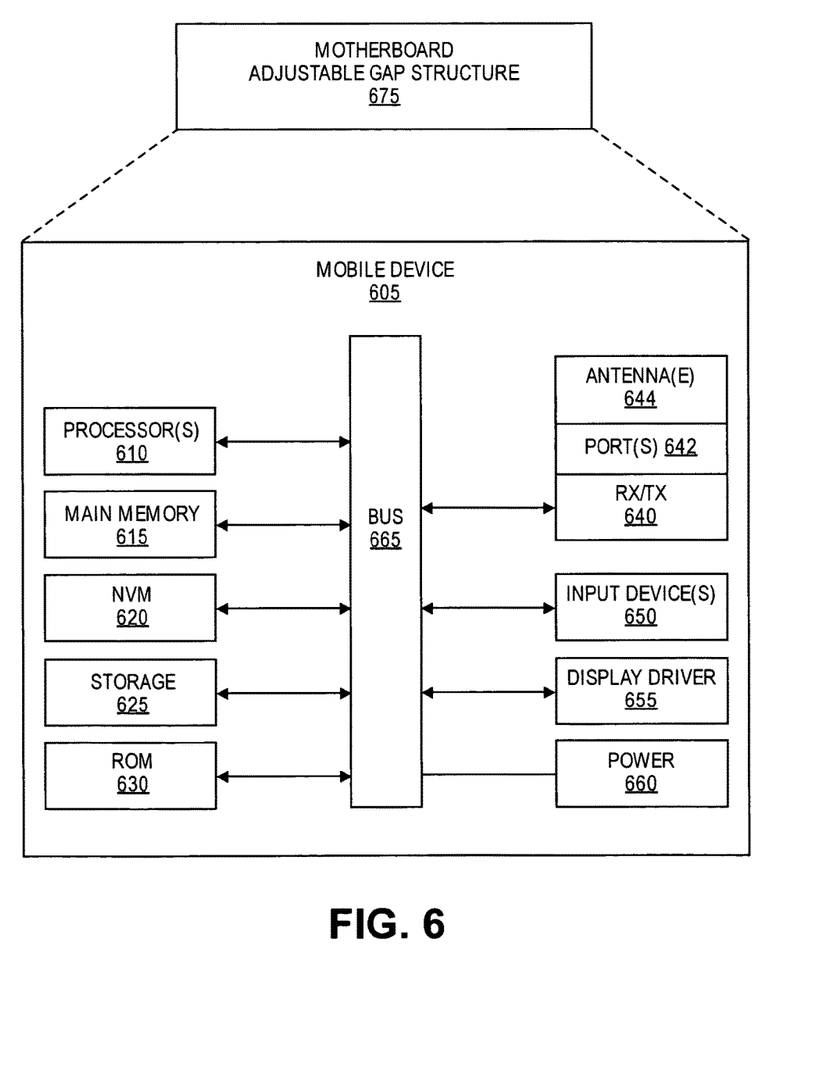
FIG. 6 is an illustration of an embodiment of a mobile device according to an embodiment.

FIG. 6 is an illustration of an embodiment of a mobile device according to an embodiment. In this illustration, certain standard and well-known components that are not germane to the present description are not shown. Elements shown as separate elements may be combined, including, for example, an SoC (System on Chip) combining multiple elements on a single chip.

In some embodiments, a mobile device 605 system includes a mother board or other structure 675 providing an adjustable gap, such as illustrated in FIGS. 1, 3-5, and 7-8.

In some embodiments, the mobile device 605 includes processing means such as one or more processors or SoC 610 coupled to one or more buses or interconnects, shown in general as bus 665. In some embodiments, the processors may include one or more general-purpose processors or special-processor processors. The bus 665 is a communication means for transmission of data. The bus 665 is illustrated as a single bus for simplicity, but may represent multiple different interconnects or buses and the component connections to such interconnects or buses may vary. The bus 665 shown in FIG. 6 is an abstraction that represents any one or more separate physical buses, point-to-point connections, or both connected by appropriate bridges, adapters, or controllers.

In some embodiments, the mobile device 605 further comprises a random access memory (RAM) or other dynamic storage device or element as a main memory 615 for storing information and instructions to be executed by the processors 610. Main memory 615 may include, but is not limited to, dynamic random access memory (DRAM). The mobile device 605 also may comprise a non-volatile memory (NVM) 620; a storage device such as a solid state drive (SSD) 625; and a read only memory (ROM) 630 or other static storage device for storing static information and instructions for the processors 610.

In some embodiments, the mobile device 605 includes one or more transmitters or receivers 640 coupled to the bus 665 to provide wired or wireless communications. In some embodiments, the mobile device 605 may include one or more antennae 644, such as dipole or monopole antennae, for the transmission and reception of data via wireless communication using a wireless transmitter, receiver, or both, and one or more ports 642 for the transmission and reception of data via wired communications. Wireless communication includes, but is not limited to, Wi-Fi, Bluetooth™, near field communication, and other wireless communication standards.

In some embodiments, mobile device 605 includes one or more input devices 650 for the input of data, including hard and soft buttons, a joy stick, a mouse or other pointing device, a keyboard, voice command system, or gesture recognition system.

In some embodiments, the mobile device 605 includes an output display 655, where the display 655 may include a liquid crystal display (LCD) or any other display technology, for displaying information or content to a user. In some environments, the display 655 may include a touch-screen that is also utilized as at least a part of an input device 650. Output display 655 may further include audio output, including one or more speakers, audio output jacks, or other audio, and other output to the user.

The mobile device 605 may also comprise a battery or other power source 660, which may include a solar cell, a fuel cell, a charged capacitor, near field inductive coupling, or other system or device for providing or generating power in the mobile device 605. The power provided by the power source 660 may be distributed as required to elements of the mobile device 605.

Figure 7:
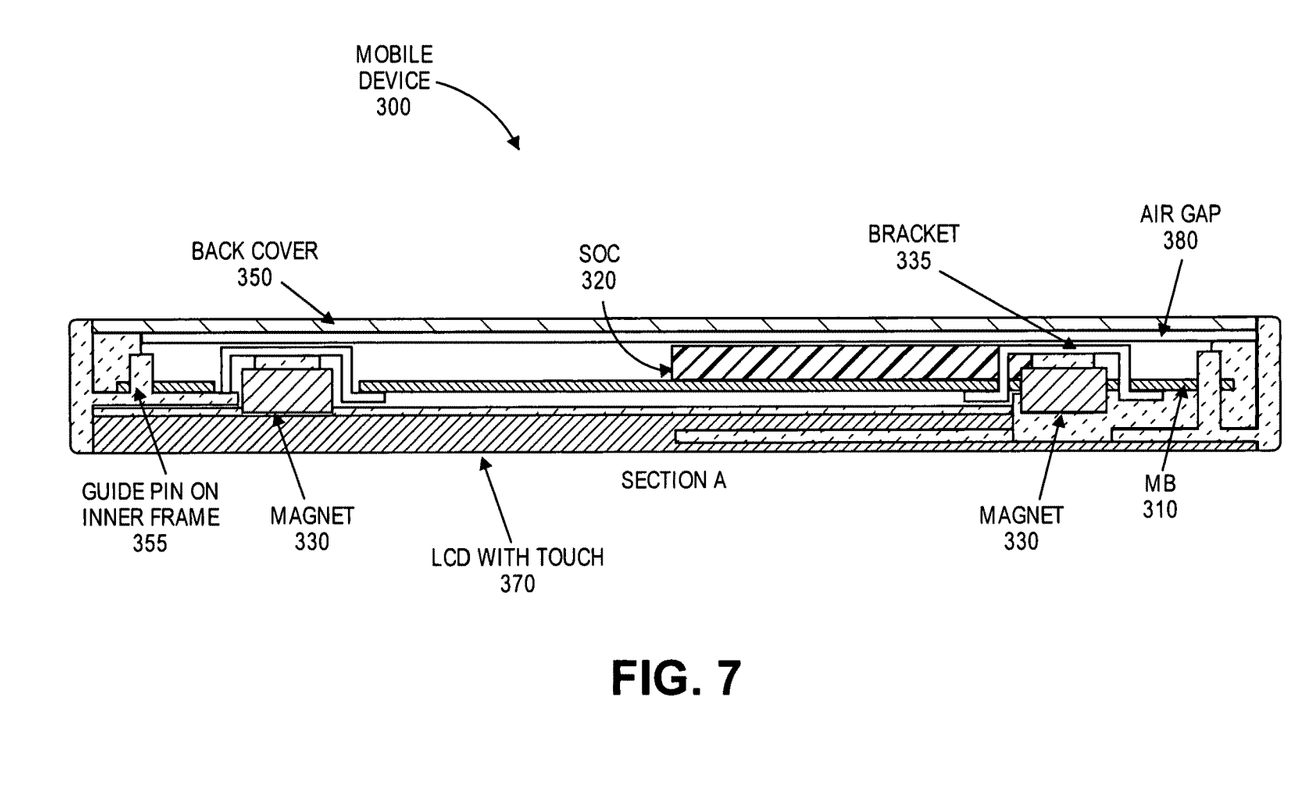
FIG. 7 illustrates a cross-section view of a mobile device according to an embodiment.

FIG. 7 illustrates a cross-section view of a mobile device according to an embodiment. In contrast with the illustration provided in FIG. 4, FIG. 7 provides an illustration without inclusion of an internal heat solution.

In some embodiments, a mobile device 300 includes a mother board 310 including multiple ferromagnetic brackets 335, the brackets being constrained by magnets 330 to maintain an air gap between a system on chip 320 and a back cover 350 of the mobile device 300. In some embodiments, the mobile device 300 further includes one or more guide pins 355 to control a motion of the mother board 310 to a single degree of freedom along a z-axis. Also illustrated is an LCD touch screen 370, wherein the mother board 310 is maintained near to the touch screen 370 in the handheld mode. In certain embodiments, the back cover 350 may include a porous cover to allow for cooling by air flow.

Figure 8:
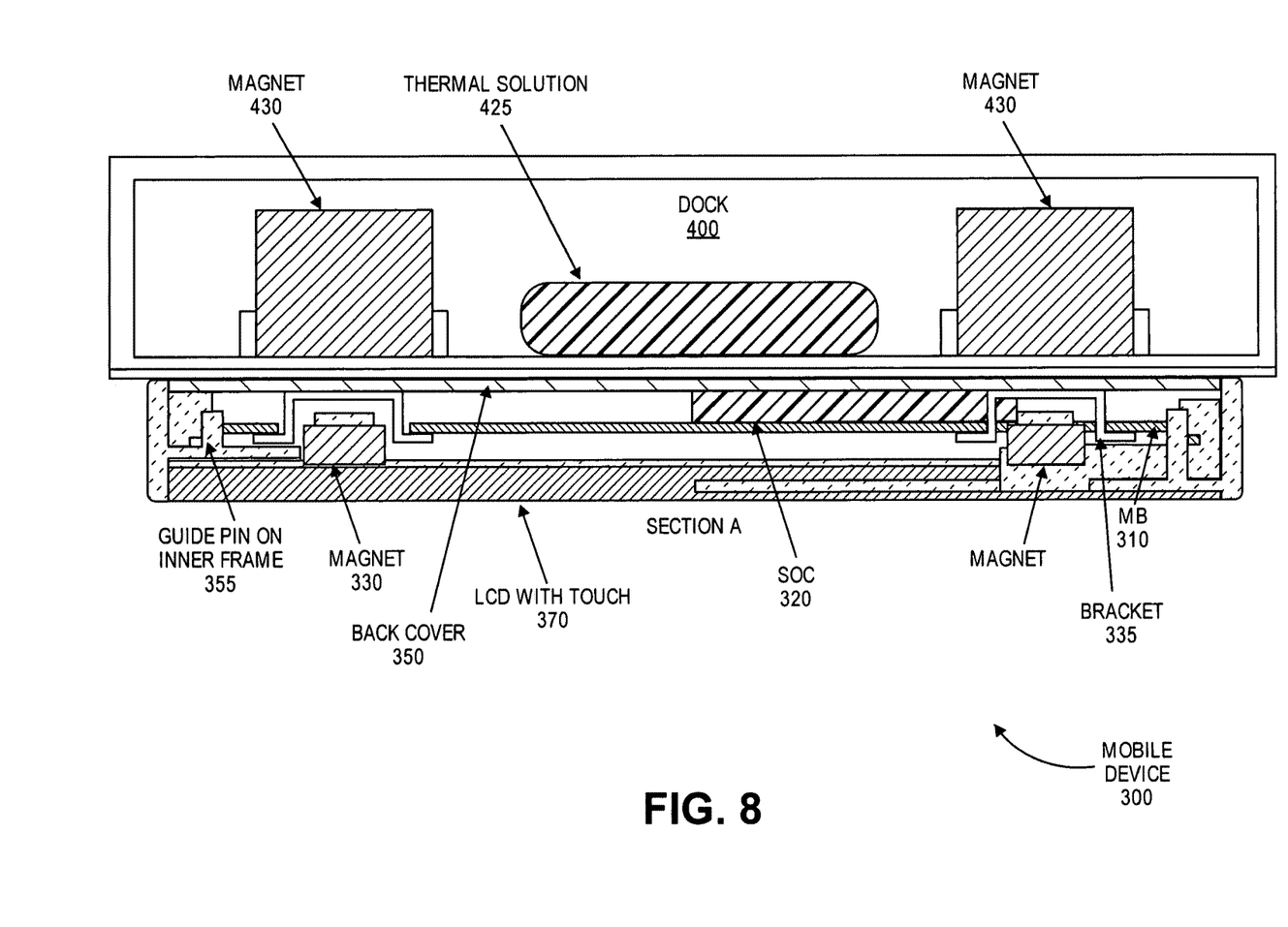
FIG. 8 illustrates a cross-section view of a mobile device and a mobile device dock according to an embodiment.

FIG. 8 illustrates a cross-section view of a mobile device and a mobile device dock according to an embodiment. In contrast with the illustration provided in FIG. 5, FIG. 8 provides an illustration without inclusion of an internal heat solution.

As illustrated, the mobile device 300 includes a mother board 310 including the multiple ferromagnetic brackets 335. In this illustration, the brackets are no longer constrained by magnets 330, the air gap between the system on chip 320 and the back cover 350 of the mobile device 300 is now reduced or eliminated, the mother board moving away from LCD touch screen 370 and towards the back cover 350, following the path enabled by the one or more guide pins 355.

In some embodiments, a dock 400 includes a thermal solution 425 to allow additional cooling of the SoC 320 of the mobile device 300. In some embodiments, the dock further includes one or more magnets (permanent or electromagnets) 430, the magnets serving to overcome the magnetic attraction of magnets 330 and pull the brackets 335 and mother board toward the back cover 350 of the mobile device. In some embodiments, the thermal solution 425 may further include a fan to direct cooling air onto the mobile device.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a mobile device includes a cover; a printed circuit board including a processing component, the printed circuit board being movable along a first axis towards or away from the cover to provide an adjustable air gap; one or more ferromagnetic elements coupled with the printed circuit board; and one or more magnets. In some embodiments, in first mode, the one or more magnets are to attract the one or more ferromagnetic elements and maintain an air gap of a first distance between the thermal solution and the cover, and, in a second mode, an external magnetic force is to pull the ferromagnetic elements away from the one or more magnets and reduce the air gap between the thermal solution and the cover.

In some embodiments, the one or more ferromagnetic elements include metal brackets.

In some embodiments, the mobile device further includes one or more guide pins to limit the movement of the printed circuit board to movement along the first axis.

In some embodiments, the first mode is a handheld mode and the second mode is a docking mode.

In some embodiments, the mobile device is to operate at a first performance level in the first mode and operate at a second performance level in the second mode, the second performance level being higher than the first performance level.

In some embodiments, the air gap is eliminated in the second mode.

In some embodiments, the mobile device further includes an internal thermal solution coupled with the processing component.

In some embodiments, the mobile device is a smart phone.

In some embodiments, the mobile device is to transition to the second mode when the mobile device is in contact with a docking mechanism.

In some embodiments, the docking mechanism includes an external thermal solution for the mobile device; and one or more magnets to provide the external magnetic force to overcome a magnetic force provided by the one more magnets of the mobile device.

In some embodiments, a method includes operating a mobile device in a first mode, the mobile device including one or magnets to maintain an air gap of a first distance in the mobile device; and transitioning the mobile device into a second mode in response to an external magnetic field overcoming a magnetic force of the one or more magnets and reducing the air gap to a second distance.

In some embodiments, the method further includes operating the mobile device at a first performance level in the first mode; and operating the mobile device at a second performance level in the second mode, the second performance level being higher than the first performance level.

In some embodiments, the air gap is eliminated in the second mode.

In some embodiments, the reduction of the air gap to the second distance enables enhanced cooling of the mobile device by an external thermal solution.

In some embodiments, the mobile device further includes a printed circuit board and one or more ferromagnetic elements coupled with the printed circuit board, the printed circuit board being movable along a first axis towards or away from the cover to provide an adjustable air gap; and maintaining the air gap of the first distance in the mobile device includes the one or more magnets to provide a magnetic force on the one or more ferromagnetic elements.

In some embodiments, the first mode is a handheld mode and wherein the second mode is a docking mode.

In some embodiments, a smart phone includes a cover including a back cover on a first side; a display screen with touch operation on a second side, the second side being opposite to the first side; a printed circuit board including a processing component, the printed circuit board being movable along a first axis towards or away from the back cover to provide an adjustable air gap; one or more ferromagnetic elements coupled with the printed circuit board; and a force element to provide a force on the printed circuit board to pull the printed circuit away the back cover. In some embodiments, in first mode, the force element is to maintain an air gap of a first distance between the thermal solution and the cover, and, in a second mode, an external magnetic force is to pull the ferromagnetic elements away from the one or more magnets and reduce the air gap between the thermal solution and the cover.

In some embodiments, the force element includes one or more magnets to provide a magnetic force on the one or more ferromagnetic elements.

In some embodiments, the force element includes a spring or elastic element to provide a physical force on the printed circuit board.

In some embodiments, the smart phone is to operate at a first performance level in the first mode and operate at a second performance level in the second mode, the second performance level being higher than the first performance level.

In some embodiments, the first mode is a handheld mode and the second mode is a docking mode.

What is claimed is:

1. A mobile device comprising:
    a cover;
    a printed circuit board including a processing component, the printed circuit board being movable along a first axis towards or away from the cover to provide an adjustable air gap;
    one or more ferromagnetic elements coupled with the printed circuit board; and
    one or more magnets;
        wherein, in first mode, the one or more magnets are to attract the one or more ferromagnetic elements and maintain an air gap of a first distance between a thermal solution and the cover, and
        wherein, in a second mode, an external magnetic force is to pull the ferromagnetic elements away from the one or more magnets and reduce the air gap between the thermal solution and the cover.

2. The mobile device of claim 1, wherein the one or more ferromagnetic elements include metal brackets.

3. The mobile device of claim 1, further comprising one or more guide pins to limit the movement of the printed circuit board to movement along the first axis.

4. The mobile device of claim 1, wherein the first mode is a handheld mode and the second mode is a docking mode.

5. The mobile device of claim 1, wherein the mobile device is to operate at a first performance level in the first mode and operate at a second performance level in the second mode, the second performance level being higher than the first performance level.

6. The mobile device of claim 1, wherein the air gap is eliminated in the second mode.

7. The mobile device of claim 1, wherein the mobile device further includes an internal thermal solution.

8. The mobile device of claim 1, wherein the mobile device is a smart phone.

9. The mobile device of claim 1, wherein the mobile device is to transition to the second mode when the mobile device is in contact with a docking mechanism.

10. The mobile device of claim 9, wherein the docking mechanism includes:
an external thermal solution for the mobile device; and
one or more magnets to provide the external magnetic force to overcome a magnetic force provided by the one more magnets of the mobile device.

11. A method comprising:
operating a mobile device in a first mode in which the mobile device uses one or more magnets included in the mobile device to maintain an air gap of a first distance in the mobile device; and
transitioning the mobile device into a second mode in which an external magnetic field originating from outside the mobile device overcomes a magnetic force of the one or more magnets and reduces the air gap to a second distance.

12. The method of claim 11, further including:
operating the mobile device at a first performance level in the first mode; and
operating the mobile device at a second performance level in the second mode, the second performance level being higher than the first performance level.

13. The method of claim 11, wherein the air gap is eliminated in the second mode.

14. The method of claim 11, wherein the reduction of the air gap to the second distance enables enhanced cooling of the mobile device by an external thermal solution.

15. The method of claim 11, wherein:
the mobile device further includes a printed circuit board and one or more ferromagnetic elements coupled with the printed circuit board, the printed circuit board being movable along a first axis towards or away from the cover to provide an adjustable air gap; and
maintaining the air gap of the first distance in the mobile device includes the one or more magnets to provide a magnetic force on the one or more ferromagnetic elements.

16. The method of claim 11, wherein the first mode is a handheld mode and wherein the second mode is a docking mode.

17. A smart phone comprising:
a cover including a back cover on a first side;
a display screen with touch operation on a second side, the second side being opposite to the first side;
a printed circuit board including a processing component, the printed circuit board being movable along a first axis towards or away from the back cover to provide an adjustable air gap; one or more ferromagnetic elements coupled with the printed circuit board; and
a force element to provide a force on the printed circuit board to pull the printed circuit away from the back cover;
wherein, in first mode, the force element is to maintain an air gap of a first distance between a thermal solution and the cover, and
wherein, in a second mode, an external magnetic force is to pull the ferromagnetic elements away from one or more magnets and reduce the air gap between the thermal solution and the cover.

18. The smart phone of claim 17, wherein the force element includes one or more magnets to provide a magnetic force on the one or more ferromagnetic elements.

19. The smart phone of claim 17, wherein the force element includes a spring or elastic element to provide a physical force on the printed circuit board.

20. The smart phone of claim 17, wherein the smart phone is to operate at a first performance level in the first mode and operate at a second performance level in the second mode, the second performance level being higher than the first performance level.

21. The smart phone of claim 17, wherein the first mode is a handheld mode and the second mode is a docking mode.

* * * * *